United States Patent
Haque et al.

(10) Patent No.: US 7,379,714 B2
(45) Date of Patent: May 27, 2008

(54) METHOD AND APPARATUS FOR DYNAMICALLY ADJUSTING A TRANSMITTER'S IMPEDANCE

(75) Inventors: Tanbir Haque, Long Island City, NY (US); Alpaslan Demir, Commack, NY (US); Leonid Kazakevich, Plainview, NY (US); Gerard Klahn, Sayville, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 572 days.

(21) Appl. No.: 11/022,703

(22) Filed: Dec. 27, 2004

(65) Prior Publication Data

US 2005/0227640 A1 Oct. 13, 2005

Related U.S. Application Data

(60) Provisional application No. 60/558,830, filed on Apr. 2, 2004, provisional application No. 60/558,831, filed on Apr. 2, 2004.

(51) Int. Cl.
  *H04B 1/02* (2006.01)
(52) U.S. Cl. ............... 455/107; 455/123; 455/125; 455/115.1; 375/304; 375/315; 343/860; 343/861
(58) Field of Classification Search ........... 455/115.1, 455/13.4, 423, 424, 425, 456.5, 456.6, 522, 455/67.11, 69, 561, 562.1, 575.7, 90.3, 121, 455/123, 125, 126, 127.1, 245.2, 91, 127.4, 455/193.1, 129, 80, 82, 127.3, 334; 330/129, 330/285, 140, 297, 124 R, 51; 375/295, 375/297, 304; 343/860, 861
See application file for complete search history.

(56) References Cited

U.S. PATENT DOCUMENTS

| | | | |
|---|---|---|---|
| 4,367,443 A | | 1/1983 | Hull et al. |
| 5,175,871 A | * | 12/1992 | Kunkel ................... 455/69 |
| 5,530,923 A | * | 6/1996 | Heinonen et al. ......... 455/126 |
| 5,564,086 A | * | 10/1996 | Cygan et al. ............. 455/126 |
| 5,903,820 A | | 5/1999 | Hagstrom |
| 5,969,681 A | | 10/1999 | O'Neill, Jr. |
| 5,994,965 A | | 11/1999 | Davis et al. |
| 6,215,987 B1 | * | 4/2001 | Fujita ..................... 455/127.3 |
| 6,265,935 B1 | * | 7/2001 | Kaneda et al. ............. 330/51 |
| 6,272,336 B1 | * | 8/2001 | Appel et al. ............. 455/423 |
| 6,298,244 B1 | * | 10/2001 | Boesch et al. ........... 455/553.1 |

(Continued)

*Primary Examiner*—Edward F. Urban
*Assistant Examiner*—Charles Chow
(74) *Attorney, Agent, or Firm*—Volpe and Koenig, P.C.

(57) ABSTRACT

A method and apparatus for dynamically adjusting the impedance between a transmitter's power amplifier (PA) and antenna to efficiently transfer power from the PA to the antenna. The impedance between the PA and the antenna is adjusted based on power level measurements and/or PA direct current (DC) consumption measurements, depending on whether the PA is a linear PA or a switch-mode PA. In another embodiment, a hybrid PA including a first stage linear PA and a second stage switch-mode PA is implemented in a transmitter. The hybrid PA selectively connects the output of the first stage linear PA to one of the input of the second stage switch-mode PA and the output of the hybrid PA, depending on the output power level of the first stage linear PA, the output power level of the hybrid PA, or a requirement indicated by a transmit power control (TPC) command.

14 Claims, 7 Drawing Sheets

U.S. PATENT DOCUMENTS

| | | |
|---|---|---|
| 6,313,698 B1 * | 11/2001 | Zhang et al. .................. 330/51 |
| 6,339,711 B1 * | 1/2002 | Otaka et al. .............. 455/550.1 |
| 6,342,812 B1 * | 1/2002 | Abdollahian et al. ... 330/124 R |
| 6,498,927 B2 * | 12/2002 | Kang et al. .............. 455/245.2 |
| 6,532,357 B1 * | 3/2003 | Ichikawa .................... 455/126 |
| 6,552,634 B1 | 4/2003 | Raab |
| 6,563,883 B1 * | 5/2003 | Leinonen et al. ........... 375/295 |
| 6,594,508 B1 | 7/2003 | Ketonen |
| 6,993,297 B2 | 1/2006 | Smith, Jr. |
| 7,116,947 B2 * | 10/2006 | Tanabe et al. ................ 455/91 |
| 7,177,370 B2 * | 2/2007 | Zhang et al. ............... 375/297 |
| 7,177,607 B2 * | 2/2007 | Weiss ...................... 455/127.1 |
| 2001/0034217 A1 * | 10/2001 | Loke et al. ................. 455/126 |
| 2002/0086643 A1 * | 7/2002 | Leipala ........................ 455/80 |
| 2003/0114182 A1 | 6/2003 | Chan et al. |
| 2004/0009754 A1 * | 1/2004 | Smith, Jr. ..................... 455/82 |
| 2004/0174214 A1 * | 9/2004 | Liu et al. .................... 330/140 |
| 2004/0176026 A1 | 9/2004 | Gainey et al. |
| 2005/0093624 A1 * | 5/2005 | Forrester et al. ............ 330/129 |
| 2006/0244533 A1 * | 11/2006 | Joly et al. ................... 330/285 |
| 2007/0024372 A1 * | 2/2007 | Hagen ....................... 330/297 |

* cited by examiner

US 7,379,714 B2

METHOD AND APPARATUS FOR DYNAMICALLY ADJUSTING A TRANSMITTER'S IMPEDANCE

CROSS REFERENCE TO RELATED APPLICATIONS

This application claims the benefit of U.S. Provisional Application Nos. 60/558,830 filed Apr. 2, 2004 and 60/558,831 filed Apr. 2, 2004, which are incorporated by reference as if fully set forth.

FIELD OF INVENTION

The present invention is related to enhancing transmitter operation. More particularly, the present invention is related to dynamically adjusting the impedance between a transmitter's power amplifier (PA) and the transmitter's antenna, and implementing a hybrid PA in the transmitter which selectively connects the input of a switch-mode PA to the output of a linear PA.

BACKGROUND

In a wireless communication system, a transmission signal is amplified by a PA before being transmitted via an antenna. Currently, reduced conduction angle AB PAs, (i.e., similar to class B), are used for constant envelope modulation schemes, and increased conduction angle AB PAs, (similar to class A), are used for non-constant envelope modulation schemes. In order to enhance transmitter efficiency and reduce battery consumption, class AB PAs with sliding bias, (i.e., current and voltage), are also used. The typical power added efficiency (PAE) in a conventional PA is roughly 35% at maximum output power.

Theoretically, switch-mode PAs are capable of achieving 100% efficiency. Practical implementations of a switch-mode PA have been shown to achieve better than 50%, (typically 60%-70%), PAE. However, the dynamic range of a low cost switch-mode PA suitable for user equipment (UE)-grade transmitters is typically less than 40 dB.

A typical transmitter in 3rd generation partnership project (3GPP) for both the time division duplex (TDD) and frequency division duplex (FDD) must be able to support at least 80 dB of output power control range. Therefore, a switch-mode power amplifier alone cannot be used as the final stage of a UE-grade transmitter.

Another important parameter that is related to a PA is impedance matching to effect maximum power transmission to an antenna. It is important to ensure that the output impedance of the PA is matched to the input impedance of the antenna. When a mismatch occurs, the transfer of power from the PA to the antenna is decreased, which results in an inefficiency of the transmitter and increased battery power consumption.

In the case of a class AB PA with sliding bias, the PA output is conjugately matched to the load at maximum rated output power. The load condition is changed based on operation conditions of the antenna. In the sliding bias class AB PA, the output impedance of the PA changes with the direct current (DC) bias. The DC bias, as well as the output load, need to be dynamically adjusted with changing output power levels to optimize the class AB PA output match and thus maximize the efficiency. The load should be dynamically adjusted to compensate for both the effects caused by the changing bias conditions of the PA as well as changing load conditions presented by the antenna.

SUMMARY

The present invention is related to a method and apparatus for dynamically adjusting the impedance between a transmitter's PA and the transmitter's antenna to efficiently transfer power from the PA to the antenna.

In one embodiment, the impedance is adjusted based on measurements of the forward power level of a linear PA and the reverse power level reflected back from the antenna. The impedance between the linear PA and the antenna is adjusted based on the measurement results.

In another embodiment, the impedance is adjusted based on measurements of the reverse power level reflected back from the antenna and a direct current (DC) level consumed by a switch-mode PA.

In yet another embodiment, a hybrid PA including a first stage linear PA and a second stage switch-mode PA is implemented in a transmitter. The hybrid PA selectively connects the output of the first stage linear PA to one of the input of the second stage switch-mode PA and the output of the hybrid PA, depending on the output power level of the first stage linear PA, the output power level of the hybrid PA, or a requirement indicated by a transmit power control (TPC) command.

The apparatus used to implement the present invention may be a transmitter, a base station, a wireless transmit/receiver unit (WTRU), an integrated circuit (IC), or the like.

BRIEF DESCRIPTION OF THE DRAWINGS

A more detailed understanding of the invention may be had from the following description, given by way of example and to be understood in conjunction with the accompanying drawings wherein.

DETAILED DESCRIPTION OF THE PREFERRED EMBODIMENTS

Hereafter, the terminology "WTRU" includes but is not limited to a UE, mobile station, fixed or mobile subscriber unit, pager, or any other type of device capable of operating in a wireless environment.

When referred to hereafter, the terminology base station includes but is not limited to an access point (AP), a Node-B, site controller or any other type of interfacing device in a wireless environment. The invention is particularly applicable to wireless local area networks (WLAN).

The features of the present invention may be incorporated into an IC or be configured in a circuit comprising a multitude of interconnecting components.

Figure 1:
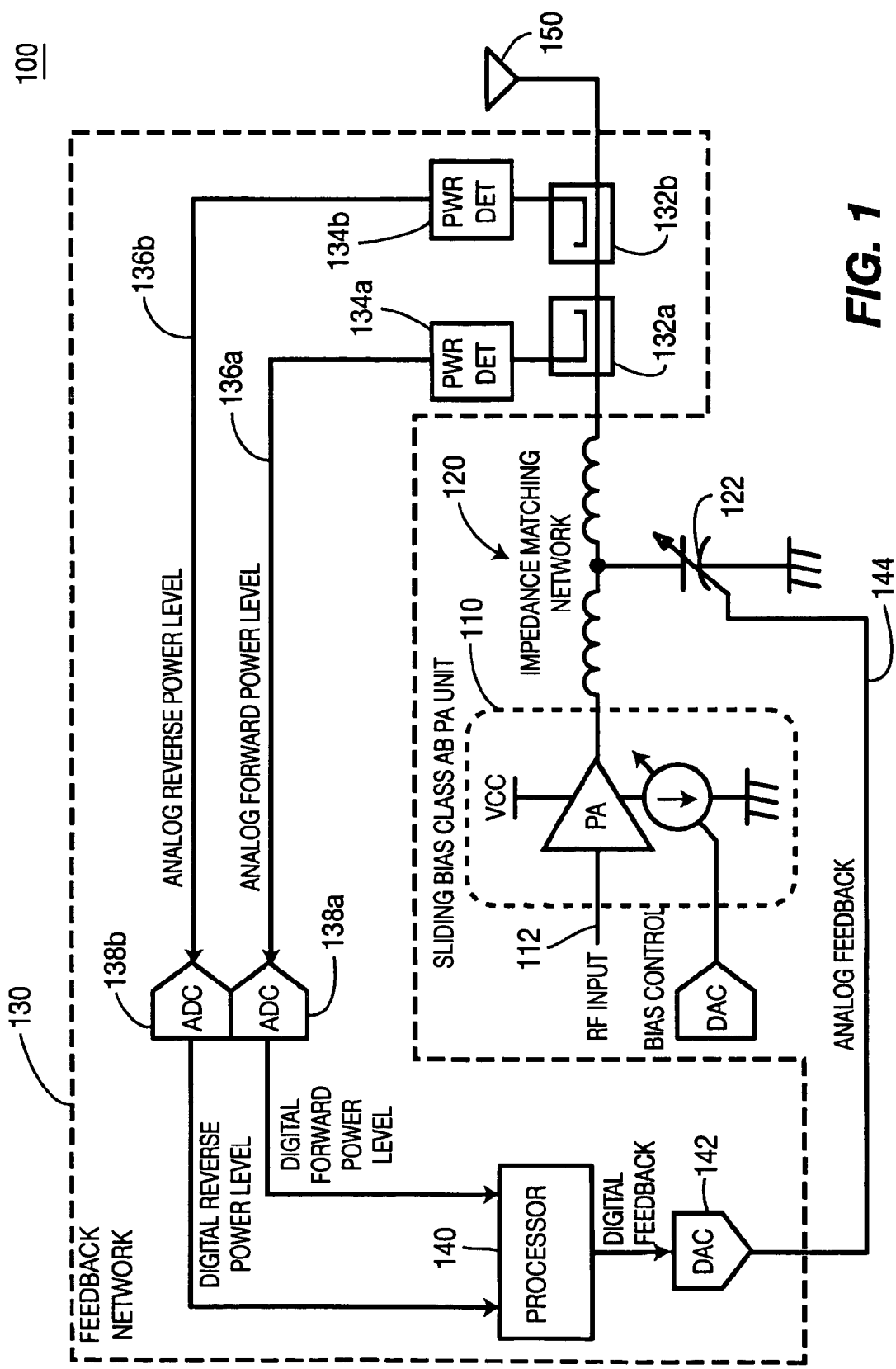
FIG. 1 is a block diagram of an apparatus for dynamic load tuning of a sliding bias class AB PA unit in accordance with one embodiment of the present invention.

FIG. 1 is a block diagram of an apparatus, (e.g., a transmitter), 100 for dynamic load tuning of a sliding bias class AB PA unit 110 in accordance with one embodiment of the present invention. The apparatus comprises the sliding bias class AB PA unit 110, an impedance matching network 120 and a feedback network 130.

As shown in FIG. 1, the PA unit 110 receives an input signal via a radio frequency (RF) input port 112 and outputs an amplified signal to an antenna 150, (or an antenna array), through the impedance matching network 120. The PA unit 110 can be any type of amplifier, (e.g., a bipolar junction transistor amplifier or a MOSFET amplifier). The antenna 150 receives the amplified signal and wireless transmits it through an air interface. The impedance matching network 120 is for matching an output impedance of the PA unit 110 to an input impedance of the antenna 150. In order to transfer maximum power to the antenna 150, the output impedance of the PA unit 110 should be matched to the input impedance of the antenna 150.

The impedance matching network 120 includes at least one impedance adjustment device 122, (e.g., a variable capacitor), for adjusting the impedance of the network 120 to match the output impedance of the switch-mode PA unit 110 to the input impedance of the antenna 150. The impedance matching network 120 may include any known combination of devices, such as capacitors, inductors, resistors, waveguide, or the like, to implement impedance matching between the PA unit 110 and the antenna 150.

As shown in FIG. 1, the impedance adjustment device 122 is adjusted by a feedback signal 142 generated by the feedback network 130. The feedback network 130 generates the feedback signal after detecting a forward power level transferred from the PA unit 110 and a reverse power level reflected back from the antenna 150. The exemplary feedback network 130 shown in FIG. 1 includes couplers 132a, 132b, power detectors 134a, 134b and a processor 140. The couplers 132a, 132b couple a signal from the transmission line from the impedance matching network 120 for feeding the antenna 150. Two couplers 132a, 132b are provided for coupling a transmitting signal and a reflecting signal.

As shown in FIG. 1, the power level of the signals coupled by the couplers 132a, 132b is detected by the power detector 134a, 134b. Two power detectors 134a, 134b are provided for the forward power level 136a and the reverse power level 136b, respectively. Alternatively, one power detector may be used in conjunction with a switch to selectively provide the forward and reverse power levels 136a, 136b, one at a time. The detected forward and reverse power levels are converted by respective analog-to-digital converters (ADCs) 138a and 138b, and are sent to the processor 140, which in turn provides a feedback signal 144 to the impedance adjustment device 122 via a digital-to-analog converter (DAC) 142. When an impedance mismatch occurs, the reverse power level 136b increases compared to the forward power level 136a. Therefore, the processor 140 generates the feedback signal 144 in accordance with the increase of the reverse power level 136b as compared to the forward power level 136a to compensate for the changing load condition.

As shown in FIG. 1, the feedback signal 144 enters the impedance matching network 120 via the impedance adjustment device 122, the impedance of which is adjusted in accordance with the feedback signal 144. The impedance of the impedance adjustment device 122 may be adjusted continuously or periodically. Alternatively, the impedance of the impedance adjustment device 122 maybe adjusted when at least one of the forward power level 136a and the reverse power level 136b exceeds a predetermined threshold.

Figure 2:
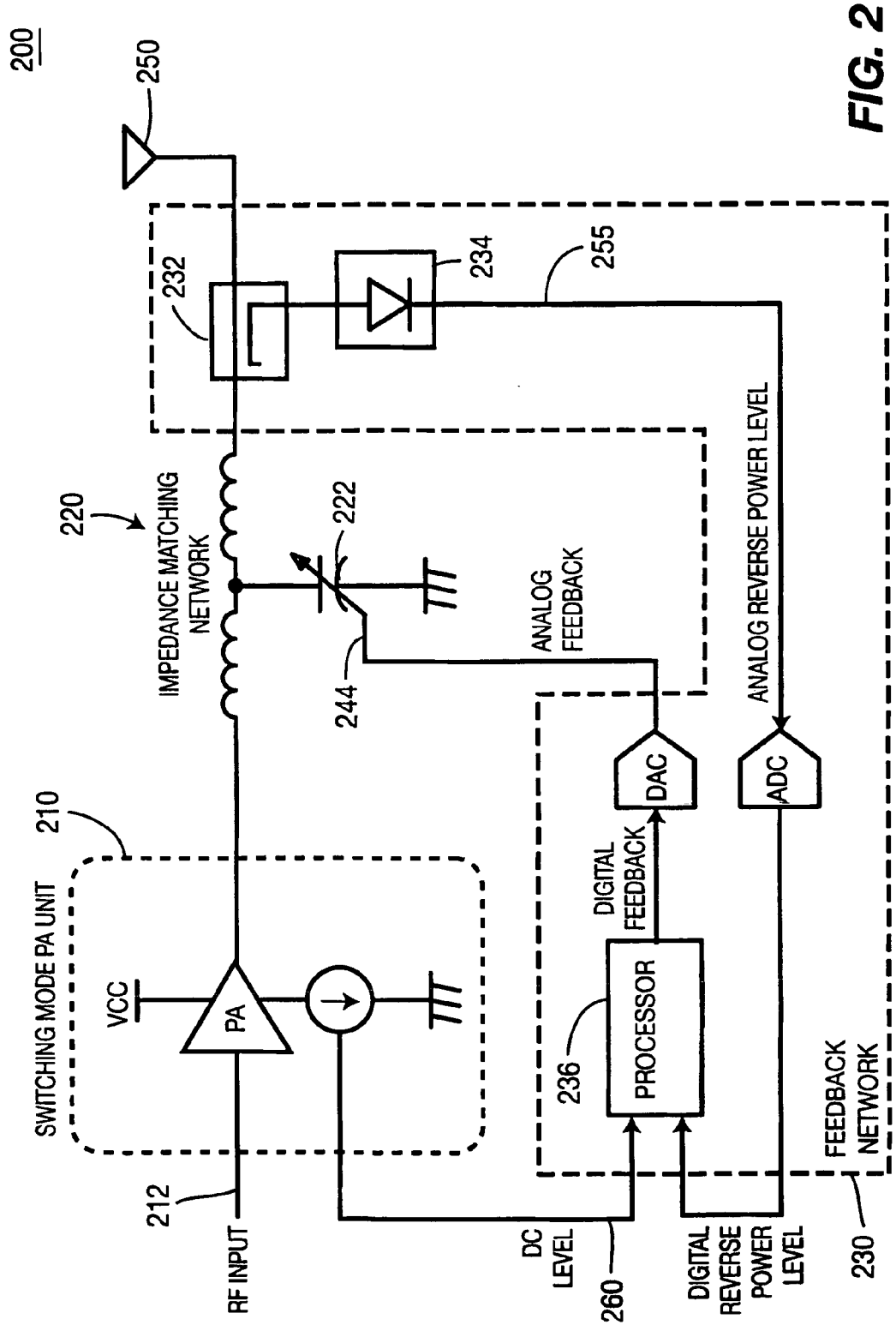
FIG. 2 is a block diagram of an apparatus for dynamic load tuning of a switch-mode PA unit in accordance with another embodiment of the present invention.

FIG. 2 is an exemplary block diagram of an apparatus, (e.g., a transmitter), 200 for dynamic load tuning of a switch-mode PA unit 210 in accordance with another embodiment of the present invention. The apparatus 200 comprises the switch-mode PA unit 210, an impedance matching network 220, and a feedback network 230.

As shown in FIG. 2, the switch-mode PA unit 210 receives an input signal via an RF input port 212 and outputs an amplified signal to an antenna 250, (or an antenna array), through the impedance matching network 220. The antenna 250 receives the amplified signal and wirelessly transmits it through an air interface. The impedance matching network 220 is for matching an output impedance of the PA unit 210 to an input impedance of the antenna 250.

The impedance matching network 220 includes at least one impedance adjustment device 222, (e.g., a variable capacitor), for adjusting the impedance of the network 220 to match the output impedance of the switch-mode PA unit 210 to the input impedance of the antenna 250. The impedance matching network 220 may include any known combination of devices, such as capacitors, inductors, resistors, waveguide, or the like, to implement impedance matching between the PA unit 210 and the antenna 250.

As shown in FIG. 2, the impedance adjustment device 222 is adjusted by a feedback signal 244 generated by the feedback network 230. The feedback network 230 generates the feedback signal 244 after detecting a reverse power level 255 reflected back from the antenna 250 and a direct current (DC) level 260 consumed in the PA unit 210. The exemplary feedback network 230 shown in FIG. 2 includes a coupler 232, a power detector 234 and a processor 236. The coupler 232 couples the impedance matching network 220 to the antenna 250 and provides samples of signals reflected by the antenna to the power detector 234.

The power level of the signals coupled by the coupler 232 is detected by the power detector 234. The detected power level is sent to the processor 236. The processor 236 also detects the DC level. The processor 236 generates a feedback signal 244 from the detected reverse power level and the DC level. When an impedance mismatch occurs, the reverse power level 255 increases and the DC level 260 consumed by the PA unit 210 also increases with a departure from an ideal output load. Therefore, the processor 236 generates the feedback signal 144 in accordance with the increase of the reverse power level 255 and the DC level 260 to compensate for the changing load condition.

As shown in FIG. 2, the feedback signal 244 is input to the impedance matching network 220 via the impedance adjustment device 222, the impedance of which is adjusted in accordance with the feedback signal 244. The impedance of the impedance adjustment device 222 may be adjusted continuously or periodically. Alternatively, the impedance of the impedance adjustment device 222 may be adjusted when at least one of the reverse power level 255 and the DC level 260 exceeds a predetermined threshold.

Figure 3A:
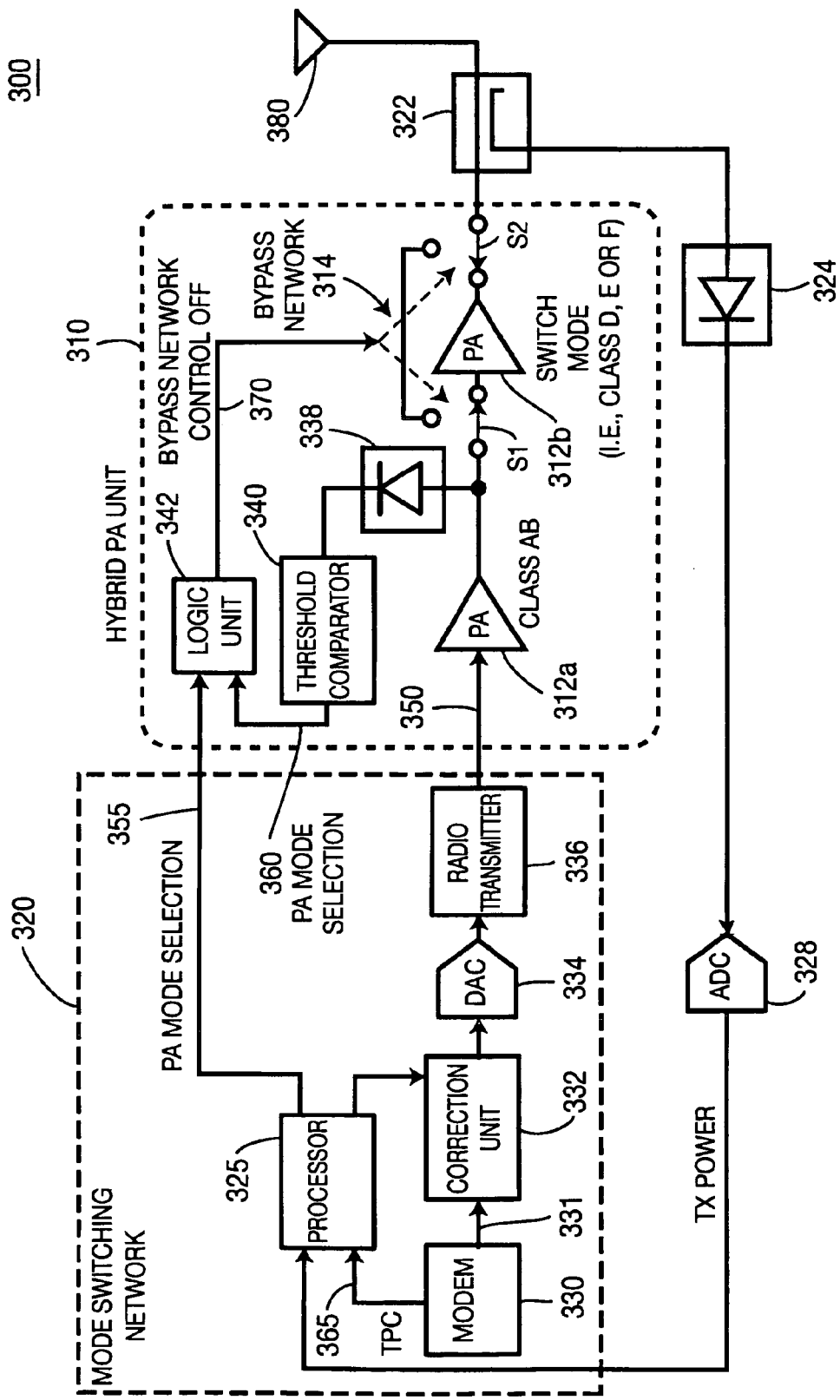
FIG. 3A is a block diagram of an apparatus for implementing one of two PA modes using both the first and second stage PAs of a hybrid PA unit in accordance with another embodiment of the present invention.
Figure 3B:
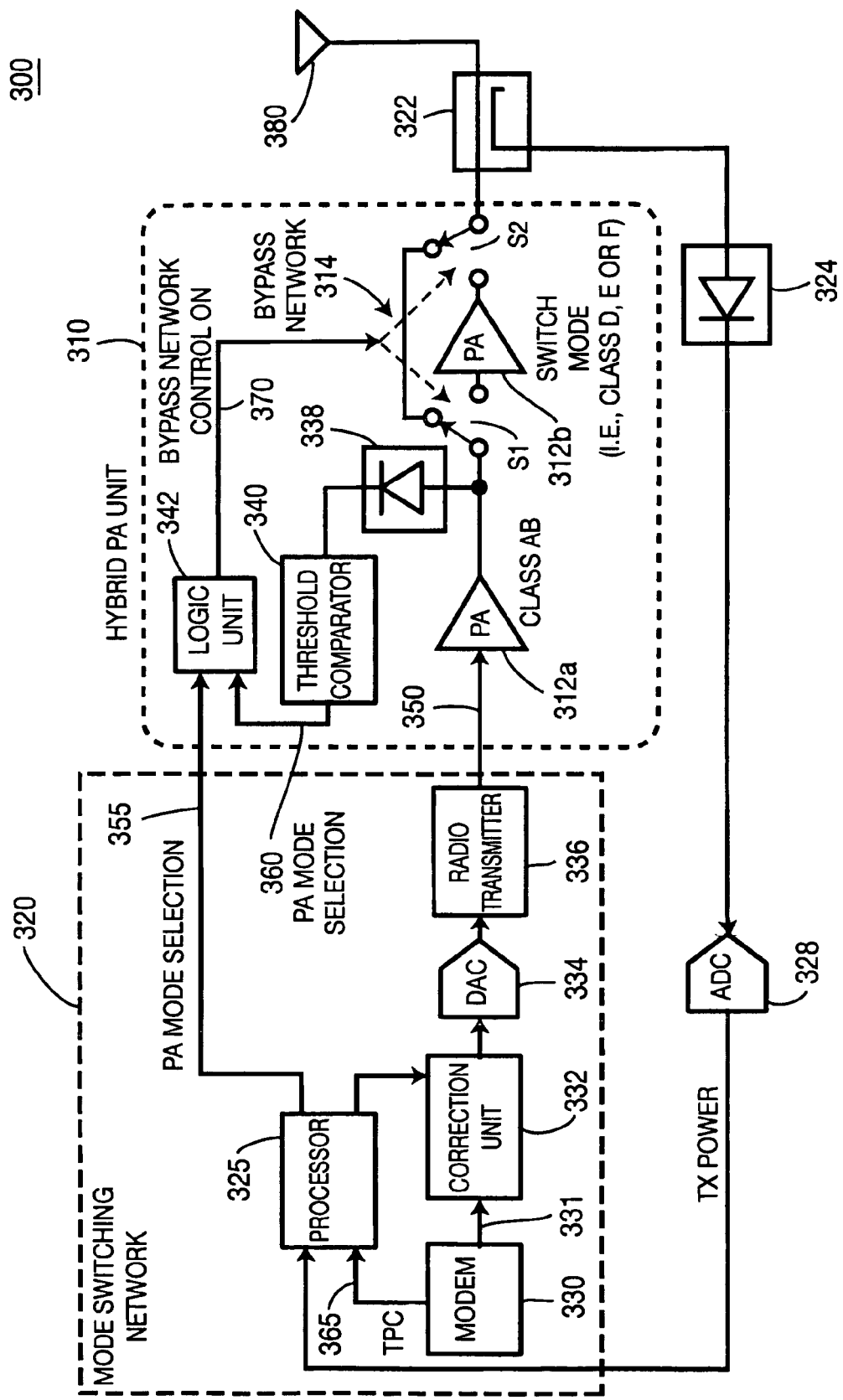
FIG. 3B is a block diagram of the apparatus of FIG. 3A when it implements the other one of the two PA modes using only the first stage PA and bypassing the second stage PA of the hybrid PA unit.

FIGS. 3A and 3B are block diagrams of an apparatus, (e.g., a transmitter), 300 for determining the optimum PA mode of a hybrid multi-stage PA unit 310 in accordance with the present invention. The apparatus 300 comprises the hybrid PA unit 310 and a mode switching network 320. The hybrid PA unit 310 comprises a first stage PA 312a connected in series to a second stage PA 312b, a bypass network 314, a power detector 338, a threshold comparator 340 and logic unit 342. The mode switching network comprises a processor 325, a modem 330, a correction unit 332, a DAC 334 and a radio transmitter 336 which provides an input signal 350 to the hybrid PA unit 310. The output power from the hybrid PA unit 310 is fed to an antenna 380 via a coupler 322 and a power detector 324 that respectively detect and measure the output power level, and preferably convert it to a digital signal using an ADC 328 which provides a digital measurement of the output of the hybrid PA unit 310 to the processor 325 which, in turn, generates a PA mode selection signal 355. The bypass network 314 is turned "on" and "off" in accordance with the PA mode selection signal 355.

The bypass network 314 includes at least two switches S1 and S2. When the bypass network 314 is off, as illustrated by FIG. 3A, the switch S1 connects the output of the first stage PA 312a to the input of the second stage PA 312B, and the switch S2 connects the output of the second stage PA 312B to the input of the coupler 322. When the bypass network 314 is turned on, as illustrated by FIG. 3B, the switches S1 and S2 bypass the second stage PA 312b and directly connect the output of the first stage PA 312a to the coupler 322.

The bypass network 314 is controlled by a bypass network control signal 370 output by the logic unit 342. The first stage PA 312a supports a different portion of the transmit power range of the hybrid PA unit 310 than the second stage PA 312b. The first stage PA 312a belongs to a different class than the second stage PA 312b. For example, the first stage PA 312a may be a linear, class AB PA, and the second stage PA 312b may be a switch-mode, class D, E or F, PA. The first stage PA 312a is used to support a lower portion of the transmitter operating, (output power), range, and the second stage PA 312b is used to support a higher portion of the transmitter operating range. Thus, the overall efficiency The mode switching network 320 selectively switches, (i.e., based on a switching hysterisis), the bypass network 314 on and off in accordance with an output power requirement. When a transmit power requirement is at a low level, the mode switching network 320 turns on the bypass network 314, as shown in FIG. 3B, whereby the input signal is amplified only by the first stage PA 312a. When a transmit power requirement is higher than a predetermined threshold, the mode switching network 320 turns off the bypass network 314, whereby the input signal 350 is amplified by both the first stage PA 312a and the second stage PA 312b, and thus the hybrid PA unit 310 operates in a different mode.

The mode switching network 320 may turn the bypass network 314 on and off based on the output power level of the hybrid PA unit 310. When the output power from the hybrid PA unit 310 is lower than a predetermined threshold, the mode switching network 320 turns on the bypass network 314, whereby the input signal is amplified only by the first stage PA 312a. When the output power from the hybrid PA unit 310 is higher than a predetermined threshold, the mode switching network 320 turns off the bypass network 314, whereby the input signal is amplified by both the first stage PA 312a and the second stage PA 312b.

The first stage PA 312a receives an input signal from a radio transmitter 336 and outputs an amplified signal. The input of the second stage PA 312b is connected to the output of the first stage PA 312a. The second stage PA 312b further amplifies the amplified signal output by the first stage PA 312a when the bypass network 314 is off, as shown in FIG. 3A.

Alternatively, the mode switching network 320 may turn the bypass network 314 on and off based on a transmit power control (TPC) command signal 365 provided by the modem 330. In a closed loop power control system, a receiving station receives signals from a transmitting station and sends a TPC command back to the transmitting station for transmit power control of the transmitting station. The present invention utilizes the TPC command in selecting an optimum mode of amplification. If a transmit power in accordance with the TPC command signal 365 does not exceed a predetermined threshold, the mode switching network 320 turns on the bypass network 314, whereby the input signal is amplified only by the first stage PA 312a. When the transmit power requirement in accordance with the TPC command is higher than a predetermined threshold, the mode switching network 320 turns off the bypass network 314, whereby the input signal 350 is amplified by both PAs 312a, PA 312b. The threshold for turning on and off may be set differently for hysteresis.

When a TPC command is detected by the modem 330 in the mode switching network 320, the TPC command is input to the processor 325 via the TPC command signal 365. The processor 325 generates the PA mode selection signal 355 based on the TPC command signal 355. The bypass network 314 is turned on and off in accordance with the PA mode selection signal 355.

The hybrid PA unit 310 uses the power detector 338 and the threshold comparator 340 for automatic mode switching. The power detector 338 detects a transmit power level output from the first stage PA 312a and the detected power level is compared with a predetermined threshold by the threshold comparator 340. If the transmit power output from the first stage PA 312a exceeds the predetermined threshold, the threshold comparator 340 generates a PA mode selection signal 360 to turn the bypass network 314 off. If the transmit power output from the first stage PA 312a falls below the predetermined threshold, the threshold comparator 340 generates a PA mode selection signal 355 to turn the bypass network 314 on, and the second stage PA 312b is bypassed. The threshold for turning on and off the bypass network 314 may be set differently for hysteresis.

The hybrid PA unit 310 uses the logic unit 342 for combining the PA mode selection signal 355 generated by the processor 325 and the PA mode selection signal 360 generated by the threshold comparator 340.

Any instantaneous gain and insertion phase variations caused by the mode switching of the hybrid PA unit 310 may be corrected in the digital baseband by the correction unit 332. The correction unit 332 corrects the in-phase (I) and quadrature (Q) components of a signal 331 generated by the modem 330. Based on at least one signal received from the processor 325, the correction unit 332 outputs a signal to the radio transmitter 336 via the DAC 334 instructing the radio transmitter 336 to increase or decrease the output power level of the input signal 350. For example, when the bypass network 314 is on, the correction unit instructs the radio transmitter 336 to increase the power level of the input signal 350.

The present invention has an advantage of high integration and possibility of using a single chip transceiver solution by reducing the PA complexity, size, and heat dissipation. The present invention results in higher yield by increasing immunity to component variations while maintaining performance, and improves the overall transmitter efficiency and extends battery life.

Figure 4:
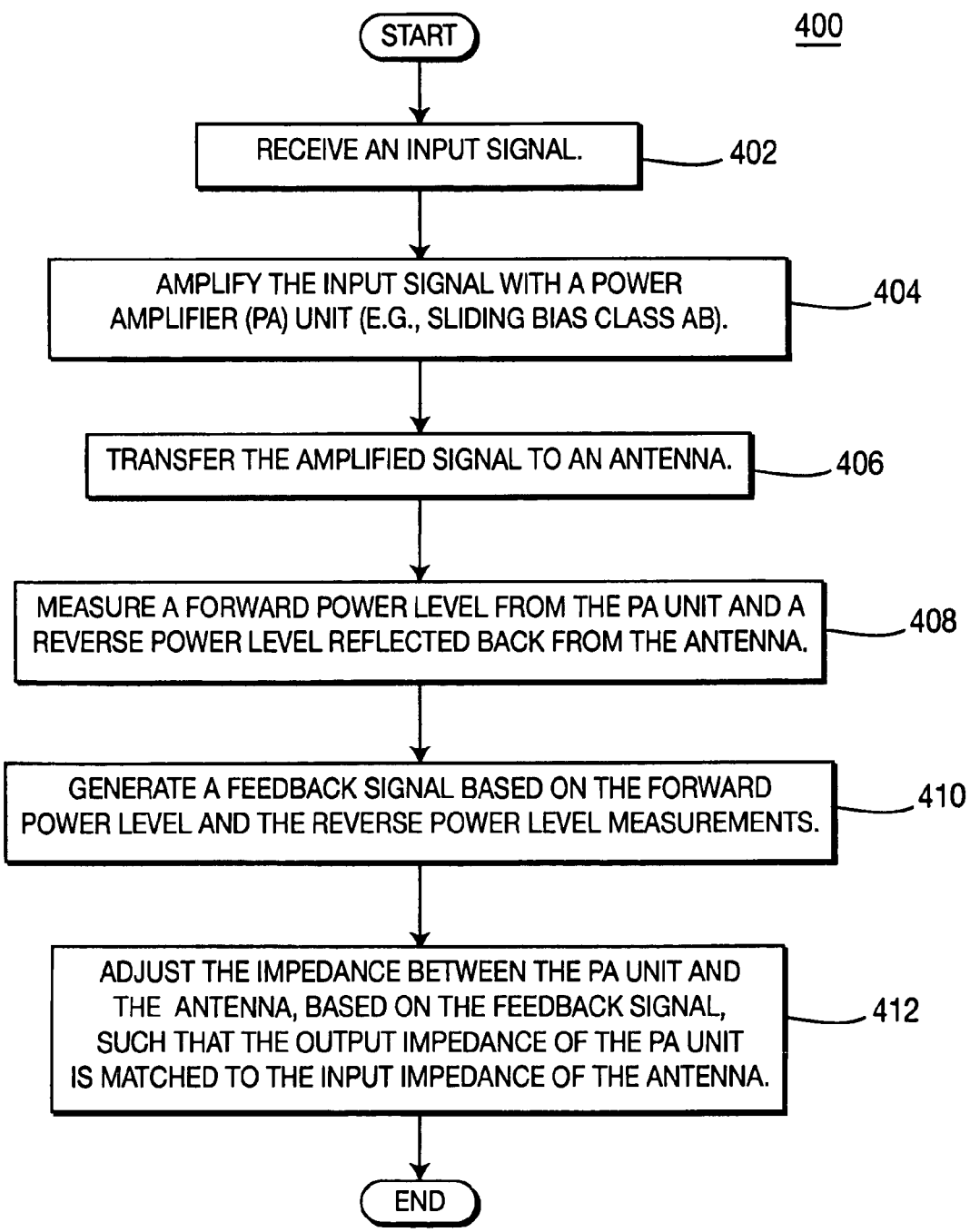
FIG. 4 is a flow diagram of a process including method steps for matching impedance between a PA and an antenna in the apparatus of FIG. 1, based on power level feedback.

FIG. 4 is a flow diagram of a process 400 including method steps for matching impedance between a PA unit 110 and an antenna 150 in the apparatus 100 shown in FIG. 1, based on power level feedback. The PA unit 110 receives an input signal 112 (step 402), amplifies the input signal 112 (step 404), and transfers the amplified input signal to the antenna 150 (step 406) via the impedance matching network 120. The forward power level 136a from the PA unit 110 and the reverse power level 136b reflected back from the antenna 140 are measured (step 408). A feedback signal 144 is generated based on the forward power level 136a and the reverse power level 136b measurements (step 410). The impedance of the matching network 120 is adjusted in accordance with the feedback signal 144 such that the output impedance of the PA unit 110 is matched to the input impedance of the antenna 150 (step 412).

The forward power level 136a and the reverse power level 136b may be converted from analog to digital signals via ADCs 138a and 138b, respectively, and input to the processor 140. The processor then outputs a digital feedback signal, which may be converted to an analog feedback signal 144 via the DAC 142 for adjusting the impedance adjustment device 122 of the impedance matching network 120. The impedance of the impedance adjustment device 122 in the impedance matching network 120 may be adjusted either continuously or periodically. Alternatively, the impedance adjustment device 122 may be adjusted when at least one of the forward power level 136a and the reverse power level 136b exceeds a predetermined threshold.

Figure 5:
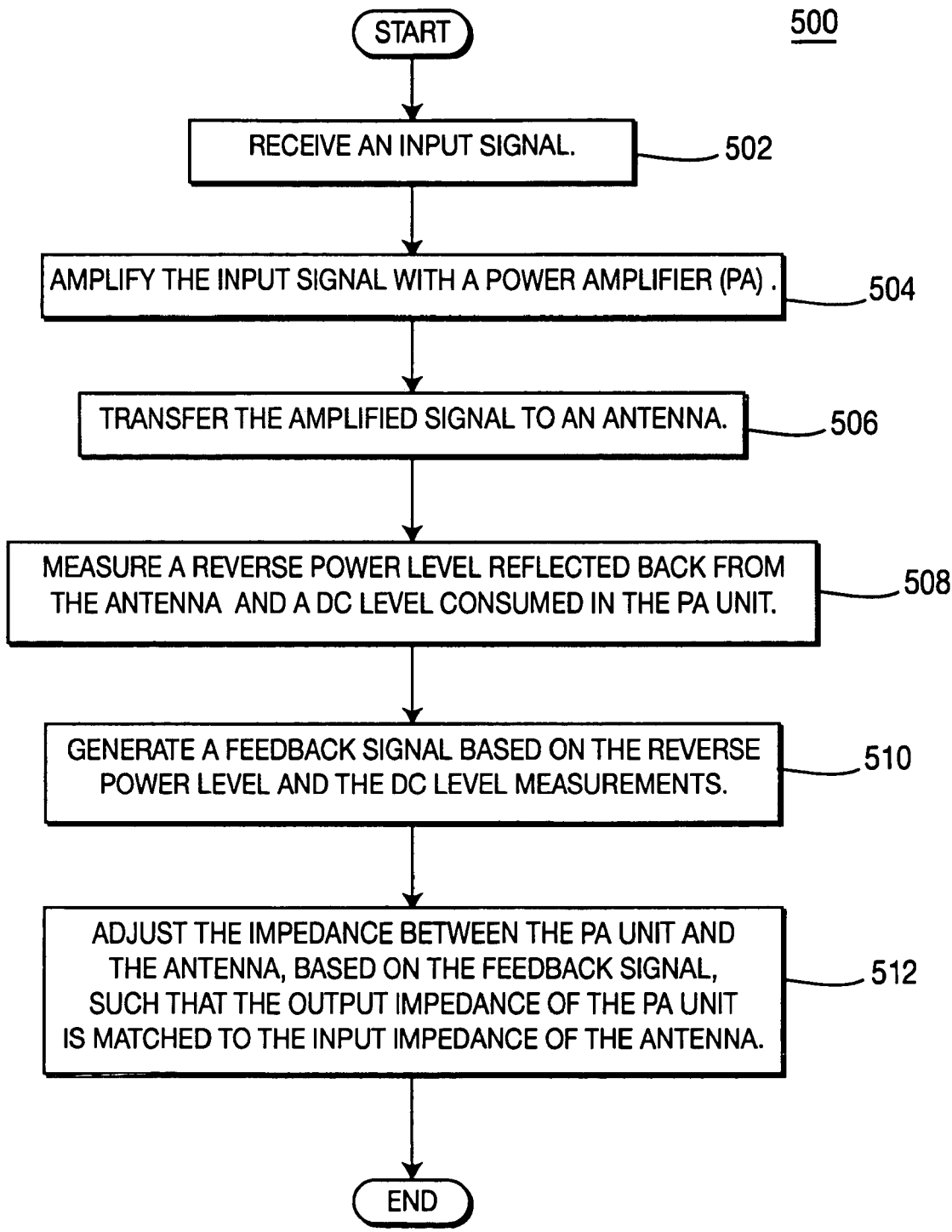
FIG. 5 is a flow diagram of a process including method steps for matching impedance between a PA and an antenna in the apparatus of FIG. 2, based on power level feedback.

FIG. 5 is a flow diagram of a process 500 including method steps for matching impedance between a PA unit 210 and an antenna 250 in the apparatus 200 shown in FIG. 2, based on power level feedback. The PA unit 210 receives an input signal 212 (step 502), and amplifies the input signal (step 504). The amplified signal is transferred to the antenna 250 (step 506). A reverse power level 255 reflected back from the antenna 250 and a DC level 260 consumed in the PA unit 210 are measured (step 508). Based on the reverse power level 255 and the DC level 260, a feedback signal 244 is generated (step 510). The impedance of the impedance matching network 220 is adjusted in accordance with the feedback signal 244 such that the output impedance of the PA unit 210 is matched to the input impedance of the antenna 250 (step 512).

The reverse power level 255 and the DC level 260 may be converted from analog to digital signals. The feedback signal 244 in digital form may be converted back to an analog signal for adjusting the impedance adjustment device 222 of the impedance matching network 220. The impedance adjustment device 222 in the impedance matching network 220 may be adjusted either continuously or periodically. Alternatively, the impedance adjustment device may be adjusted when at least one of the reverse power level 255 and the DC level 260 exceeds a predetermined threshold.

Figure 6:
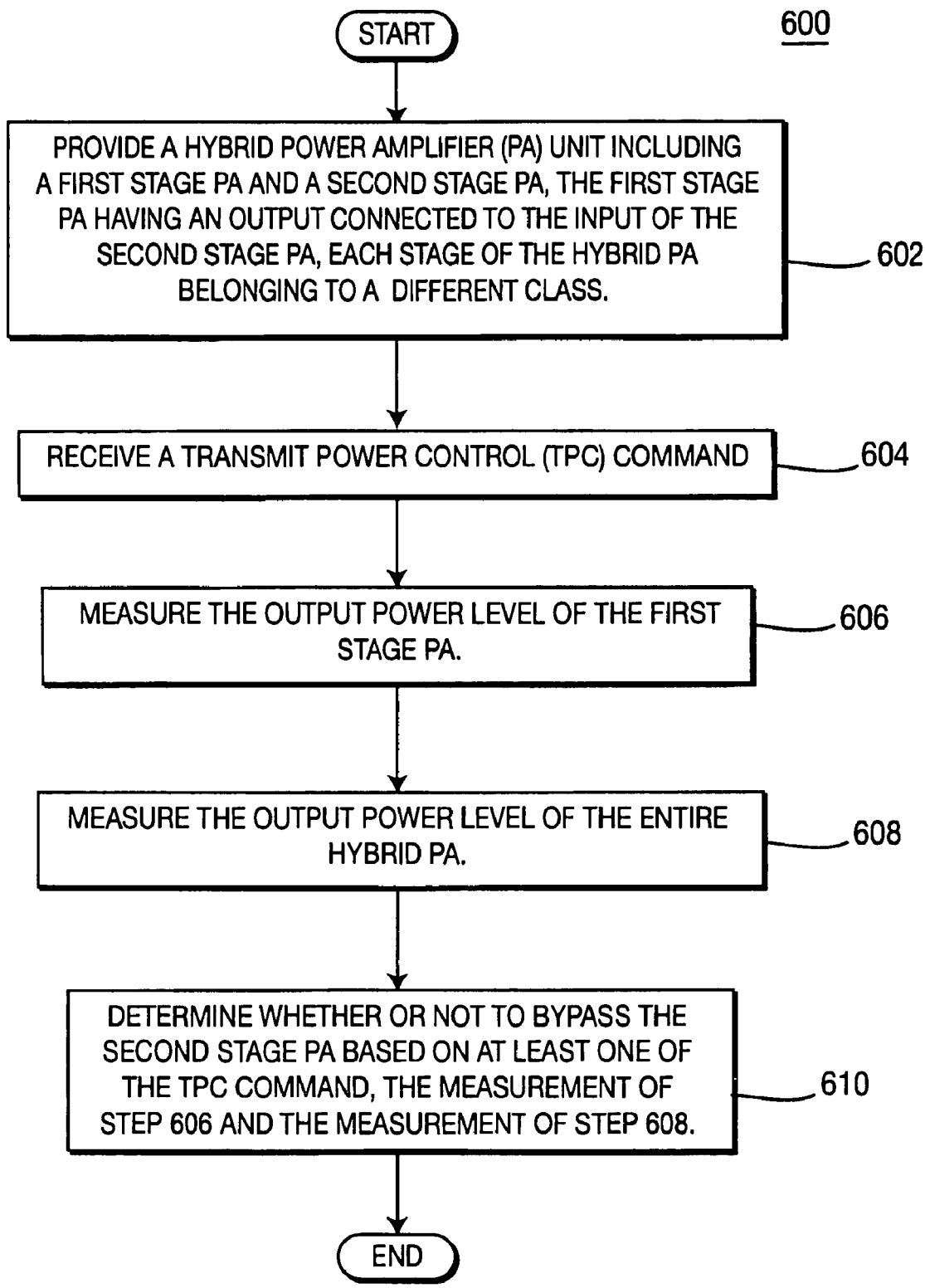
FIG. 6 is a flow diagram of a process including method steps for selectively bypassing a second amplification stage of a PA unit in the apparatus of FIG. 3, based on power level feedback and TPC commands.

FIG. 6 is a flow diagram of a process 600 including method steps for determining the optimum PA mode of the hybrid PA unit 310 in the apparatus 300 shown in FIG. 3. In step 602, a hybrid PA unit 310 including a first stage PA 312a and a second stage PA 312b is provided. The first stage PA 312a has an output connected to an input of the second stage PA 312b. The PAs 312a, 312b are of different classes and are connected in series. Each of the PAs 312a, 312b supports a different portion of the transmit power range of the hybrid PA unit 310.

The gain provided by the hybrid PA unit 310 is controlled by received TPC commands, whereby the second stage PA 312b is selectively bypassed and/or disabled based on the requirements of the TPC commands.

Still referring to FIG. 6, a TPC command is received at the modem 330 and forwarded to the processor 325 (step 604). In step 606, the power level of the output of the first stage PA 312a is measured by the power detector 338 for use by the threshold comparator 340 (step 608). In step 608, the output power level of, (i.e., the transmit power), of the entire hybrid PA unit 310 is measured by the power detector 324 for use by the processor 325. In step 610, the logic unit 342 determines whether or not to bypass the second stage PA 312b based on at least one of the received TPC command received in step 604, (i.e., the PA mode selection signal 355), the output power level measurement of the first stage PA 312a, (i.e., the PA mode selection signal 360), and the output power level measurement of the entire hybrid PA 310 as detected by the power detector 324.

Although the features and elements of the present invention are described in the preferred embodiments in particular combinations, each feature or element can be used alone without the other features and elements of the preferred embodiments or in various combinations with or without other features and elements of the present invention.

While the present invention has been described in terms of the preferred embodiment, other variations which are within the scope of the invention as outlined in the claims below will be apparent to those skilled in the art.

What is claimed is:

1. A transmitter comprising:
a power amplifier (PA) configured to amplify an input signal;
an antenna configured to transmit a signal amplified by the PA;
an impedance matching network having an input in communication with the PA and an output in communication with the antenna, the impedance matching network configured to match an output impedance of the PA to an input impedance of the antenna, the impedance matching network including at least one impedance adjustment device;
a first power detector configured to measure, at the output of the impedance matching network, a forward power level from the PA output;
a second power detector configured to measure, at the output of the impedance matching network, a reverse power level reflected back from the antenna;
a first analog-to-digital converter (ADC) coupled to the first power detector, the first ADC configured to convert the forward power level measurement to a digital forward power level measurement;
a second ADC coupled to the second power detector, the second ADC configured to convert the reverse power level measurement to a digital reverse power level measurement;
a digital-to-analog converter (DAC) coupled to the impedance adjustment device; and
a processor, coupled to the first and second ADCs and the DAC, the processor configured to receive the digital power level measurements via the ADCs, and adjust the impedance adjustment device based on the digital power level measurements by sending a feedback signal to the impedance adjustment device via the DAC.

2. The transmitter of claim 1 whereby a power transfer from the PA to the antenna is maximized by adjusting the impedance adjustment device such that the output impedance of the PA is matched to the input impedance of the antenna.

3. The transmitter of claim 1 wherein the impedance adjustment device is adjusted either continuously or periodically.

4. The transmitter of claim 1 wherein the impedance adjustment device is adjusted when at least one of the forward power level and the reverse power level exceeds a predetermined threshold.

5. The transmitter of claim 1 wherein the PA is a sliding bias class AB PA.

6. A wireless transmit/receive unit (WTRU) comprising the transmitter of claim 1.

7. A base station comprising the transmitter of claim 1.

8. A transmitter comprising:
   a power amplifier (PA) configured to amplify an input signal;
   an antenna configured to transmit a signal amplified by the PA;
   an impedance matching network having an input in communication with the PA and an output in communication with the antenna, the impedance matching network configured to match an output impedance of the PA to an input impedance of the antenna, the impedance matching network including at least one impedance adjustment device;
   a power detector configured to measure, at the output of the impedance matching network, a reverse power level reflected back from the antenna;
   an analog-to-digital converter (ADC) coupled to the power detector, the ADC configured to convert the reverse power level measurement to a digital reverse power level measurement;
   a digital-to-analog converter (DAC) coupled to the impedance adjustment device; and
   a processor, coupled to the ADC and the DAC, the processor configured to receive an indication of a direct current (DC) level consumed by the PA, receive the digital reverse power level measurement via the ADC, and adjust the impedance adjustment devices, based on the DC level consumed by the PA and the digital reverse power level measurement, by sending a feedback signal to the impedance adjustment device via the DAC.

9. The transmitter of claim 8 whereby a power transfer from the PA to the antenna is maximized by adjusting the impedance adjustment device such that the output impedance of the PA is matched to the input impedance of the antenna.

10. The transmitter of claim 8 wherein the impedance adjustment device is adjusted either continuously or periodically.

11. The transmitter of claim 8 wherein the impedance adjustment device is adjusted when at least one of the DC level and the reverse power level exceeds a predetermined threshold.

12. The transmitter of claim 8 wherein the PA is a switch-mode PA.

13. A wireless transmit/receive unit (WTRU) comprising the transmitter of claim 8.

14. A base station comprising the transmitter of claim 8.

* * * * *

UNITED STATES PATENT AND TRADEMARK OFFICE
CERTIFICATE OF CORRECTION

PATENT NO. : 7,379,714 B2 Page 1 of 1
APPLICATION NO. : 11/022703
DATED : May 27, 2008
INVENTOR(S) : Haque et al.

It is certified that error appears in the above-identified patent and that said Letters Patent is hereby corrected as shown below:

At column 3, line 21, before the word "transmits", delete "wireless", and insert therefor --wirelessly--.

At column 4, line 7, before the word "adjusted", delete "maybe", and insert therefor --may be--.

At column 5, line 37, after the word "transmitter", delete "operating, (output power), range,", and insert therefor --operating range (output power),--.

At column 5, line 40, after the word "efficiency", insert --is improved and battery life extended--.

At column 8, line 14, after "TPC", delete "command" and insert therefor --commands--.

At claim 8, column 10, line 8, after the word "adjustment", delete "devices," and insert therefor --device,--.

Signed and Sealed this

Ninth Day of September, 2008

JON W. DUDAS
*Director of the United States Patent and Trademark Office*